United States Patent
Glatkowski et al.

(10) Patent No.: US 7,118,693 B2
(45) Date of Patent: *Oct. 10, 2006

(54) CONFORMAL COATINGS COMPRISING CARBON NANOTUBES

(75) Inventors: Paul J. Glatkowski, Littleton, MA (US); Nelson Landrau, Marlborough, MA (US); David H. Landis, Jr., Barrington, RI (US); Joseph W. Piche, Raynham, MA (US); Jeffrey L. Conroy, Rumford, RI (US)

(73) Assignee: Eikos, Inc., Franklin, MA (US)

( * ) Notice: Subject to any disclaimer, the term of this patent is extended or adjusted under 35 U.S.C. 154(b) by 267 days.

This patent is subject to a terminal disclaimer.

(21) Appl. No.: 10/201,568

(22) Filed: Jul. 24, 2002

(65) Prior Publication Data

US 2004/0071949 A1    Apr. 15, 2004

Related U.S. Application Data

(60) Provisional application No. 60/307,885, filed on Jul. 27, 2001.

(51) Int. Cl.
- H01B 1/24    (2006.01)
- H05K 1/00    (2006.01)
- B32B 3/26    (2006.01)
- B32B 9/00    (2006.01)

(52) U.S. Cl. ............ 252/502; 252/500; 252/511; 174/35 R; 977/742; 977/750; 361/818; 428/36.91; 428/323; 428/313.3; 428/315.5; 428/408; 428/922; 428/924; 423/445 B; 423/447.3; 423/447.1

(58) Field of Classification Search ............ 252/500, 252/502, 510, 512, 518.1, 511; 523/127; 428/376, 36.91, 36.92, 323, 313.3, 315.5, 428/408; 977/742–750; 174/35 R; 361/818; 423/443 B, 447.1, 447.3

See application file for complete search history.

(56) References Cited

U.S. PATENT DOCUMENTS

| | | | |
|---|---|---|---|
| 4,959,752 A * | 9/1990 | Samarov et al. ............ 361/818 |
| 5,098,771 A * | 3/1992 | Friend ........................ 428/209 |
| 5,304,326 A | 4/1994 | Goto et al. | |
| 5,366,664 A * | 11/1994 | Varadan et al. ............. 252/512 |
| 5,424,054 A | 6/1995 | Bethune et al. | |
| 5,639,989 A * | 6/1997 | Higgins, III ........... 174/35 MS |
| 5,643,502 A | 7/1997 | Nahass et al. | |
| 5,853,877 A * | 12/1998 | Shibuta ...................... 428/357 |
| 5,908,585 A * | 6/1999 | Shibuta ...................... 252/506 |
| 6,221,330 B1 | 4/2001 | Moy et al. | |
| 6,265,466 B1 | 7/2001 | Glatkowski et al. | |
| 6,333,016 B1 | 12/2001 | Resasco et al. | |
| 2002/0046872 A1* | 4/2002 | Smalley et al. .......... 174/137 A |
| 2003/0122111 A1* | 7/2003 | Glatkowski ................. 252/500 |

FOREIGN PATENT DOCUMENTS

| | | | |
|---|---|---|---|
| JP | 2000-026760 A | * | 1/2000 |
| WO | WO 01/92381 | * | 6/2001 |
| WO | WO 01/92381 | | 12/2001 |

* cited by examiner

Primary Examiner—Douglas McGinty
Assistant Examiner—Kallambella Vijayakumar
(74) Attorney, Agent, or Firm—Novak Druce & Quigg LLP

(57) ABSTRACT

The invention is directed to conformal coatings that provide excellent shielding against electromagnetic interference (EMI). A conformal coating comprises an insulating layer and a conducting layer containing electrically conductive material. The insulating layer comprises materials for protecting a coated object. The conducting layer comprises materials that provide EMI shielding such as carbon black, carbon buckeyballs, carbon nanotubes, chemically-modified carbon nanotubes and combinations thereof. The insulating layer and the conductive layer may be the same or different, and may be applied to an object simultaneously or sequentially. Accordingly, the invention is also directed to objects that are partially or completely coated with a conformal coating that provides EMI shielding.

34 Claims, No Drawings

CONFORMAL COATINGS COMPRISING CARBON NANOTUBES

REFERENCE TO RELATED APPLICATIONS

The application claims priority to U.S. Provisional Application No. 60/307,885, entitled "EMI Shielding with Carbon Nanotubes," filed Jul. 27, 2001.

GOVERNMENT INTEREST

This invention was made, in part, with support for the United State government under a grant from the U.S. Army, SBIR No. DAAH01-01-C-R098, and the U.S. Government has certain rights to this invention.

BACKGROUND OF THE INVENTION

1. Field of the Invention

The instant invention relates to a conformal coating that provides excellent shielding against electromagnetic interference (EMI). More particularly, the instant invention relates to conformal coating comprising an insulating layer and a conducting layer. It is particularly preferred that the conducting layer of the instant invention comprises carbon nanotubes.

2. Description of Background

The demand for electronic assemblies in the automotive, aerospace and various other industries has resulted in the annual production of millions of electronic assemblies by manufacturers in the electronics industry. Often, demand has increased to the point that additional processing equipment and floor space is required to meet the growing demand. To enhance their production efficiencies, electronics manufacturers continuously seek to implement new technologies which can increase output without a corresponding increase in capital, floor space and labor.

As is also well known in the art, electronic assemblies are often required to be capable of withstanding hostile operating environments, such as those commonly found in the automotive and aerospace industries. One practice widely accepted in the electronics industry is the use of a conformal coating which forms a protective barrier layer on the circuit board. Conformal coatings are formulated to protect the electronic assembly from moisture and dirt, as well as make the circuit devices mounted to the circuit board more resistant to vibration.

Specifically, a conformal coating is a thin layer of insulating material with a consistent thickness that closely conforms to the shape and contours of the entire substrate, such as a circuit board. This polymeric covering shields metallic junctions and sensitive components from the deleterious effect of the environment. When properly applied, the coating is a barrier against adverse hazards like dust and dirt, moisture, harsh solvents, high atmospheric humidity, airborne chemical vapors and environmental contaminants. Contamination can compromise a circuit board's operational life. When bare circuits are exposed to humid air, thick films of water molecules can form on their surfaces. Moisture on uncoated circuits can induce metallic growth and corrosion. The thicker the water film, the lower the surface insulation resistance, and the greater the effects on electrical signal transmission. This can result in cross talk, electrical leakage from high-impedance circuits and intermittent transmission, all leading to diminished and often terminated circuit performance. Conformal coatings permit closer circuit traces and decreased line spacing popular with high-component densities and minimizing shorts from bridging. Conformal coatings support components so the solder joints do not carry the entire mass of the component. Many coatings can even improve resistance to abrasion, thermal shock and vibration. These coatings are essential in automotive assemblies, industrial controls domestic appliances, certain consumer products, military and aerospace systems, and medical devices.

Conformal coatings find application in device components of cell phones and computers, particularly integrated circuits, printed wire boards, and printed circuit boards.

Generally, conformal coatings have been composed of polymeric materials of the silicone, acrylic, urethane and epoxy families. These families can be divided into groups based on their particular systems and their curing characteristics. For example, there are two-part material systems which cure upon mixing of the two components, one-part solvent-borne systems such as acrylic and hydrocarbon resins, one-part moisture cure systems, such as urethanes, epoxies and silicones, one-part frozen premixed systems, one-part heat-cured systems, ultraviolet (UV) cured systems, and vacuum deposited materials such as parylene, available through the Union Carbide Corporation.

Other than the vacuum depositing materials, the above coating systems are typically applied by dipping, spraying or brushing techniques, and occasionally are deposited as multiple layers. The product design, the coating process and the process capacity will generally dictate which type of coating system can-be applied for a given application.

In recent years a need has developed, particularly in the aerospace industry and in military applications, for electrical connectors providing effective shielding against electromagnetic interference (EMI) and, in certain applications, having the ability to withstand severe EMI conditions.

It is widely understood that highly conducting materials provide EMI shielding. The development of intrinsically conductive organic polymers and plastics has been ongoing since the late 1970's. These efforts have yielded conductive materials based on polymers such as polyanaline, polythiophene, polypyrrole, and polyacetylene (See "*Electrical Conductivity in Conjugated Polymers.*" Conductive Polymers and Plastics in Industrial Applications", Arthur E. Epstein; "*Conductive Polymers.*" Ease of Processing Spearheads Commercial Success; Report from Technical Insights; Frost & Sullivan; "*From Conductive Polymers to Organic Metals.*" Chemical Innovation, Bernhard Wessling).

A significant discovery was that of carbon nanotubes, which are essentially single graphite layers wrapped into tubes, either single walled nanotubes (SWNTs) or double walled (DWNTs) or multi walled (MWNTs) wrapped in several concentric layers (B. I. Yakobson and R. E. Smalley, "Fullerene Nanotubes: $C_{1,000,000}$ and Beyond", *American Scientist* v.85, July–August 1997). Although only first widely reported in 1991 (Phillip Ball, "Through the Nanotube", *New Scientist*, 6 Jul. 1996, p. 28–31), carbon nanotubes are now readily synthesized in gram quantities in the laboratories all over the world, and are also being offered commercially. The tubes have good intrinsic electrical conductivity and have been used in conductive materials.

Heretofore, conformal coating comprising carbon nanotubes that provides EMI shielding has not been disclosed.

SUMMARY OF THE INVENTION

Accordingly, the invention provides, in a preferred embodiment, a conformal coating that provides EMI shielding, wherein said coating comprises: an insulating layer; and a conductive layer which may be disposed on or combined with the insulating layer, wherein the conductive layer comprises a electrically conductive material. Accordingly, the insulating layer and the conductive layer may be the same or different. The electrically conductive material may comprise carbon black, an electrically conductive metal such as, for example, nickel, silver or copper, carbon nanotubes, chemically- or structurally-modified carbon nanotubes, or a combination thereof.

In another preferred embodiment, the invention provides a coated substrate with EMI shielding comprising: a substrate; and a conformal coating disposed on said substrate that provides EMI shielding, wherein said coating comprises: an insulating layer; and a nanotube-containing layer disposed on said insulating layer, wherein said nanotube-containing layer comprises a plurality of carbon nanotubes. Preferably, the EM shielding is from 5–70 dB or greater.

In another preferred embodiment, the invention provides a method for imparting EMI shielding to a substrate, comprising coating said substrate with a conformal coating wherein said conformal coating comprises: an insulating layer; and a nanotube-containing layer disposed on said insulating layer, wherein said nanotube-containing layer comprises a plurality of carbon nanotubes.

In another preferred embodiment, the invention provides a conformal coating that provides EMI shielding, wherein said coating comprises a plurality of carbon nanotubes and a polymer selected from the group comprising acrylics, epoxies, silicone, polyurethane, and parylene.

In another preferred embodiment, the invention provides a dispersion comprising a plurality of carbon nanotubes and a conformal coating material selected from the group comprising polyurethanes, parylene, acrylics, epoxies and silicone.

Other embodiments and advantages of the invention are set forth, in part, in the following description, will be obvious from this description, or may be learned from the practice of the invention.

DESCRIPTION OF THE INVENTION

While the invention is described and disclosed here in connection with certain preferred embodiments, the description is not intended to limit the invention to the specific embodiments shown and described here, but rather the invention is intended to cover all alternative embodiments and modifications that fall within the spirit and scope of the invention as defined by the claims included herein as well as any equivalents of the disclosed and claimed invention.

Conformal coatings of the instant invention protect device components from moisture, fungus, dust, corrosion, abrasion, and other environmental stresses. The instant coatings conform to virtually any shape such as crevices, holes, points, sharp edges and points, and flat, exposed surfaces.

In general, the invention is directed to the discovery that conformal coatings impart excellent EMI shielding. In general, the instant conformal coatings comprise an insulating layer and a layer comprising conducting materials. Alternatively, the insulating and the conducting layer may be the same.

The instant conformal coatings provide EMI shielding properties in the 10–70 dB attenuation range. Preferably, the instant coatings provide EMI shielding in the 20–70 dB attenuation range. Even more preferably, the instant coatings provide EMI shielding in the 30–70 dB attenuation range. Even still more preferably, the instant coatings provide EMI shielding in the 40–70 dB attenuation range.

Preferably, the insulating layer is a layer that comprises conventional conformal coatings. Generally, the insulating layer may comprise a conformal coating material. Preferably, the insulating layer comprises a material selected from any known conformal coating, such as polyurethanes, parylene, acrylics, epoxy and silicone. The advantages of these preferred conformal coatings are given below:

Type AR (acrylic)—Acrylics are easy to apply conformal coatings that are not that resistant to abrasions and chemicals.

Type ER (epoxy)—Epoxies are fairly easy to apply and very hard to remove.

Type SR (silicone)—Silicone conformal coatings are for high temperature environments.

Type UR (urethanes)—Polyurethane's are the most popular conformal coatings, offering humidity, chemical and abrasion protection.

Type XY (parylene)—is a vacuum deposited conformal coating. They offer excellent resistance to humidity, moisture, abrasion, high temperatures and chemicals.

The conducting layer may comprise any electrically conductive material, including, but not limited to carbon black or metals such as silver, nickel, or copper.

In a preferred embodiment, the conducting layer comprises carbon nanotubes. It has surprisingly been discovered that carbon nanotubes impart EMI shielding to conformal coatings. In general, carbon nanotubes can exhibit electrical conductivity as high as copper, thermal conductivity as high as diamond, strength 100 times greater than steel at one sixth the weight, and high strain to failure. However, heretofore, there has been no report of carbon nanotubes in a conformal coating. Films comprising nanotubes are disclosed in U.S. patent application Ser. No. 10/105,623, entitled COATINGS COMPRISING CARBON NANOTUBES AND METHODS FOR FORMING THE SAME, filed Mar. 26, 2002, the disclosure of which is incorporated herein by reference in its entirety.

Nanotubes are known and have a conventional meaning (R. Saito, G. Dresselhaus, M. S. Dresselhaus, "Physical Properties of Carbon Nanotubes," Imperial College Press, London U.K. 1998, or A. Zettl "Non-Carbon Nanotubes" Advanced Materials, 8, p. 443 (1996)).

In a preferred embodiment, nanotubes of this invention comprises straight and bent multi-walled nanotubes (MWNTs), straight and bent double-walled nanotubes (DWNTs) and straight and bent single-walled nanotubes (SWNTs), and various compositions of these nanotube forms and common by-products contained in nanotube preparations such as described in U.S. Pat. No. 6,333,016 and WO 01/92381, which are incorporated herein by reference in their entirety.

In another preferred embodiment, it has been discovered that nanotubes with an outer diameter of less than 3.5 nm are preferred to impart conductivity and EMI shielding to conformal coatings.

The nanotubes of the instant invention have an outer diameter of less than 3.5 nm. In another preferred embodiment, nanotubes of the instant invention have an outer diameter of less than 3.25 nm. In another preferred embodiment, nanotubes of the instant invention have an outer diameter of less than 3.0 nm. In another preferred embodiment, the nanotubes have an outer diameter of about 0.5 to about 2.5 nm. In another preferred embodiment, the nanotubes have an outer diameter of about 0.5 to about 2.0 nm. In another preferred embodiment, the nanotubes have an outer diameter of about 0.5 to about 1.5 nm. In another preferred embodiment, the nanotubes have an outer diameter of about 0.5 to about 1.0 nm.

The aspect ratio may be between 1.5 and 2,000,000, preferably between 10 and 20,000, and more preferably between 15 and 2,000.

In a preferred embodiment, the nanotubes comprise single walled carbon-nanotubes (SWNTs). SWNTs can be formed by a number of techniques, such as laser ablation of a carbon target, decomposing a hydrocarbon, and setting up an arc between two graphite electrodes. For example, U.S. Pat. No. 5,424,054 to Bethune et al. describes a process for producing single-walled carbon nanotubes by contacting carbon vapor with cobalt catalyst. The carbon vapor is produced by electric arc heating of solid carbon, which can be amorphous carbon, graphite, activated or decolorizing carbon or mixtures thereof. Other techniques of carbon heating are discussed, for instance laser heating, electron beam heating and RF induction heating. Smalley (Guo, T., Nikoleev, P., Thess, A., Colbert, D. T., and Smally, R. E., Chem. Phys. Lett. 243: 1–12 (1995)) describes a method of producing single-walled carbon nanotubes wherein graphite rods and a transition metal are simultaneously vaporized by a high-temperature laser. Smalley (Thess, A., Lee, R., Nikolaev, P., Dai, H., Petit, P., Robert, J., Xu, C., Lee, Y. H., Kim, S. G., Rinzler, A. G., Colbert, D. T., Scuseria, G. E., Tonarek, D., Fischer, J. E., and Smalley, R. E., Science, 273: 483–487 (1996)) also describes a process for production of single-walled carbon nanotubes in which a graphite rod containing a small amount of transition metal is laser vaporized in an oven at about 1,200° C. Single-wall nanotubes were reported to be produced in yields of more than 70%. U.S. Pat. No. 6,221,330, which is incorporated herein by reference in its entirety, discloses methods of producing single-walled carbon nanotubes which employs gaseous carbon feed stocks and unsupported catalysts.

SWNTs are very flexible and naturally aggregate to form ropes of tubes. The formation of SWNT ropes in the coating or film allows the conductivity to be very high, while loading is very low, and results in a good transparency and low haze.

In another preferred embodiment, the nanotubes may be chemically modified, such as treatment with acid, base, or other reagent.

For example, acid treatment of nanotubes may be accomplished by blending in the appropriate amount of nanotubes in a mixture of concentrated acid, such as nitric or concentrated sulfuric acid. This mixture may be heated at 70° C. without stirring for approximately 30 minutes. After 30 minutes of heating, the reaction mixture is cooled and centrifuged. The supernatant liquid is then decanted and the functionalized nanotubes are washed several times with water until a neutral pH is achieved.

After the tubes are functionalized they can be readily solvent exchanged and combined with conformal coatings or further derivatized by conventional synthetic techniques to incorporate other functional groups, moieties or residues.

Accordingly, in a preferred embodiment, the nanotube-containing layer has a surface resistance in the range of less than about $10^4$ ohms/square. Preferably, the nanotube-containing layer has a surface resistance in the range of about $10^{-2}$–$10^4$ ohms/square. Even more preferably, the film has a surface resistance in the range of less than about $10^3$ ohms/square. Even more preferably still, the film has a surface resistance in the range of less than about $10^2$ ohms/square. Still even more preferably, the film has a surface resistance in the range of about $10^{-2}$–$10^0$ ohms/square.

The instant nanotube-containing layer also has volume resistances in the range of about $10^{-2}$ ohms-cm to about $10^4$ ohms-cm. The volume resistances are as defined in ASTM D4496-87 and ASTM D257-99.

The nanotube-containing layer should demonstrate excellent transparency and low haze. For example, the instant film has a total transmittance of at least about 60%.

In a preferred embodiment, the nanotube-containing layer has a total light transmittance of about 80% or more. In another preferred embodiment, the nanotube-containing layer has a total light transmittance of about 85% or more. In another preferred embodiment, the nanotube-containing layer has a total light transmittance of about 90% or more. In another preferred embodiment, the nanotube-containing layer has a total light transmittance of about 95% or more. In another preferred embodiment, the nanotube-containing layer has a haze value less than 1%. In another preferred embodiment, the nanotube-containing layer has a haze value less than 0.5%.

Total light transmittance refers to the percentage of energy in the electromagnetic spectrum with wavelengths less than $1 \times 10^{-2}$ cm that passes through the films, thus necessarily including wavelengths of visible light.

The nanotube-containing layer range from moderately thick to very thin. For example, the second layer can have a thickness between about 0.5 nm to about 1,000 microns. In a preferred embodiment, the nanotube-containing layer can have a thickness between about 0.005 to about 1,000 microns. In another preferred embodiment, the nanotube-containing layer has a thickness between about 0.05 to about 500 microns. In another preferred embodiment, the nanotube-containing layer has a thickness between about 0.05 to about 500 microns. In another preferred embodiment, the nanotube-containing layer has a thickness between about 0.05 to about 400 microns. In another preferred embodiment, the nanotube-containing layer has a thickness between about 1.0 to about 300 microns. In another preferred embodiment, the nanotube-containing layer has a thickness between about 1.0 to about 200 microns. In another preferred embodiment, the nanotube-containing layer has a thickness between about 1.0 to about 100 microns. In another preferred embodiment, the nanotube-containing layer has a thickness between about 1.0 to about 50 microns.

In another preferred embodiment, the nanotube-containing layer further comprises a polymeric material. The polymeric material may be selected from a wide range of natural or synthetic polymeric resins. The particular polymer may be chosen in accordance with the strength, structure, or design needs of a desired application. In a preferred embodiment, the polymeric material comprises a material selected from the group comprising thermoplastics, thermosetting polymers, elastomers and combinations thereof. In another preferred embodiment, the polymeric material comprises a material selected from the group comprising of polyethylene, polypropylene, polyvinyl chloride, styrenic, polyurethane, polyimide, polycarbonate, polyethylene terephthalate, cellulose, gelatin, chitin, polypeptides, polysaccharides, polynucleotides and mixtures thereof. In another preferred embodiment, the polymeric material comprises a material selected from the group comprising ceramic hybrid polymers, phosphine oxides and chalcogenides.

In another preferred embodiment, the polymer is a conformal coating material selected from the group comprising polyurethanes, parylene, acrylics, epoxies and silicone.

In another preferred embodiment, nanotube-containing layer is over-coated with a polymeric layer. Preferably, the polymeric layer comprises a conformal coating material selected from the group comprising polyurethanes, parylene, acrylics, epoxies and silicone.

The nanotube-containing layer may be easily formed and applied as a dispersion of nanotubes alone in such solvents as acetone, water, ethers, alcohols, and combinations thereof. There are several methods to apply conformal coating to substrates. Some of the methods are typically performed manually while others are automated. Selection of the coating method and material is dependent on the environmental conditions the substrate will be exposed to during normal operation.

One of the preferred methods of coating is the dip process. The dip process can be done manually or automatically. In the manual mode operators immerse the substrate in a tank of coating material. The coated parts are then hung to dry. The automatic dip systems consist of a tank of coating material and a conveyer to move the substrate. The substrates are placed on hangers that convey them to the tank, then through the coating material, and then removed. Like the manual dip method the coated parts are then hung to dry. The advantages of this system are low capital investment, simplicity, and high throughput.

Brushing the material on the substrate is another preferred method of application. This is a manual process where the operator dips a brush into a container of coating material and brushes the material onto the substrate. The advantages of this system are no equipment investment, no tooling or masking required, and the process is simple.

Manually spray painting is another common method used to apply conformal coatings to substrates. In this method the operator can easily spray the substrate with a hand held sprayer gun similar to those used to spray paint. The freshly spray coated boards are then allowed to cure prior to removal. Like dip coating and brush application the advantages of this system are low capital investment, simplicity, and limited tooling.

Needle dispensing can either be done by hand or by an automated process. A simple tool valve can be used to turn material on and off. The material is forced through a needle and is dispensed as a bead. The beads are strategically placed on the board allowing the material to flow and coat the appropriate area. The advantages of this system are low equipment investment, no tooling or masking required, and the process is simple.

Conformal coatings can also be selectively applied using a dispenser mounted to a robot. The robot is programmed to move and dispense coating material in designated locations on the substrate. The above process can either be manually or conveyer loaded. The advantages of this system are consistent application of material, high throughputs, no custom tooling, material saving, closed fluid system, and no masking. Manufacturers of printed circuit boards are continually faced with higher cost related material and process decisions when addressing environmental impact of electronic assembly. In addressing the trade-off associated with regulatory compliance manufacturers strive for a contemporary approach to overall process savings in a synergistic fashion. To this end, manufacturers have turned to selective application of coating material.

The method for curing a conformal coating depends on the type of coating used. The most commonly used methods are heat, UV, chemical reaction (moisture cure, free radical polymerization, etc.), or a combination of any of the above-mentioned techniques.

The instant conformal coatings may be in a number of different forms including, but not limited to, a solid film, a partial film, a foam, a gel, a semi-solid, a powder, or a fluid.

The instant nanotube-containing layers comprising nanotubes in a proper amount mixed with a polymer can be easily synthesized. At most a few routine parametric variation tests may be required to optimize amounts for a desired purpose. Appropriate processing control for achieving a desired array of nanotubes with respect to the plastic material can be achieved using conventional mixing and processing methodology, including but not limited to, conventional extrusion, multi-dye extrusion, press lamination, etc. methods or other techniques applicable to incorporation of nanotubes into a polymer.

The nanotubes may be dispersed substantially homogeneously throughout the polymeric material but can also be present in gradient fashion, increasing or decreasing in amount (e.g. concentration) from the external surface toward the middle of the material or from one surface to another, etc. Alternatively, the nanotubes can be dispersed as an external skin or internal layer thus forming interlaminate structures.

In a preferred embodiment, the instant nanotube films can themselves be over-coated with a polymeric material. In this way, the invention contemplates, in a preferred embodiment, novel laminates or multi-layered structures comprising films of nanotubes over coated with another coating of an inorganic or organic polymeric material. These laminates can be easily formed based on the foregoing procedures and are highly effective for distributing or transporting electrical charge. The layers, for example, may be conductive, such as tin-indium mixed oxide (ITO), antimony-tin mixed oxide (ATO), fluorine-doped tin oxide (FTO), aluminum-doped zinc oxide (FZO) layer, or provide UV absorbance, such as a zinc oxide (ZnO) layer, or a doped oxide layer, or a hard coat such as a silicon coat. In this way, each layer may provide a separate characteristic.

In a preferred embodiment, the nanotubes are oriented by exposing the films to a shearing, stretching, or elongating step or the like (e.g. using conventional polymer processing methodology). Such shearing-type processing refers to the use of force to induce flow or shear into the film, forcing a spacing, alignment, reorientation, disentangling etc. of the nanotubes from each other greater than that achieved for nanotubes simply formulated either by themselves or in admixture with polymeric materials. Oriented nanotubes are discussed, for example in U.S. Pat. No. 6,265,466, which is incorporated herein by reference in its entirety. Such disentanglement etc. can be achieved by extrusion techniques, application of pressure more or less parallel to a surface of the composite, or application and differential force to different surfaces thereof, e.g., by shearing treatment by pulling of an extruded plaque at a variable but controlled rate to control the amount of shear and elongation applied to the extruded plaque. It is believed that this orientation results in superior properties of the film, e.g., enhanced electromagnetic (EM) shielding.

Oriented refers to the axial direction of the nanotubes. The tubes can either be randomly oriented, orthogonoly oriented (nanotube arrays), or preferably, the nanotubes are oriented in the plane of the film.

In a preferred embodiment, the invention contemplates a plurality of differentially-oriented nanotube-containing layer wherein each layer can be oriented and adjusted, thus forming filters or polarizers.

In another preferred embodiment, the instant invention provides a dispersion comprising a plurality of carbon nanotubes and a conformal coating material. The conformal coating material may include one or more of polyurethanes, parylene, acrylics, epoxies or silicone. The nanotubes may be single-walled nanotubes (SWNTs), double-walled nanotubes (DWNTs), multi-walled nanotubes (MWNTs), and mixtures thereof. Preferably, the nanotubes are substantially single-walled nanotubes (SWNTs). The instant dispersion may comprise an a polymeric material comprising thermoplastics, thermosetting polymers, elastomers, conducting polymers and combinations thereof. The dispersion may further comprise a plasticizer, softening agent, filler, reinforcing agent, processing aid, stabilizer, antioxidant, dispersing agent, binder, a cross-linking agent, a coloring agent, a UV absorbent agent, or a charge adjusting agent. The instant dispersion may further comprise a conductive organic particles, inorganic particles or combinations or mixtures thereof, such as buckeyballs, carbon black, fullerenes, nickel, silver, copper and combinations thereof. Preferably, the dispersion can form a coating, wherein the coating provides EMI shielding properties in the 10–70 dB attenuation range.

The present invention, thus generally described, will be understood more readily by reference to the following examples, which are provided by way of illustration and are not intended to be limiting of the present invention.

Although only a few exemplary embodiments of the present invention have been described in detail in this disclosure, those skilled in the art who review this disclosure will readily appreciate that many modifications are possible in the exemplary embodiments (such as variations in sizes, structures, shapes and proportions of the various elements, values of parameters, or use of materials) without materially departing from the novel teachings and advantages of the invention. Accordingly, all such modifications are intended to be included within the scope of the invention as defined in the appended claims. Other substitutions, modifications, changes and omissions may be made in the design, operating conditions and arrangement of the preferred embodiments without departing from the spirit of the invention as expressed in the appended claims.

As used herein and in the following claims, articles such as "the", "a" and "an" can connote the singular or plural.

Carbon Nanotubes to Impart EMI Shielding to Commercial Coatings and Films

Carbon nanotubes were formulated and over-coated with 4 types of conformal coatings for coating printed circuit assemblies as recognized by, e.g. military specification MIL-1-46058. These conformal coatings were then applied on industry standard FR4 PWB substrates and compared to a non-filled control. The conductivity and EMI shielding properties of the novel coating system were characterized. This provides a conceptual demonstration of how the instant invention can convert most major types of commercially available coatings into an EMI shielding coating. The technical results and details are provided in the following section.

Summary of Test Results

Carbon nanotubes were formulated with each of four conformal coatings, representing all the major types (under military specification MIL-1-46058). These resins were then coated on standard FR4 PCB substrates with corresponding controls. Free standing films were also formed to demonstrate the utility of nanotubes to impart EMI shielding to other films and coatings. Conductivity and EMI shielding properties of the coatings were evaluated. Results show that a thin nanotube composite coatings and films provide EMI shielding. Successful demonstration of this concept provides a means of converting most major type of commercially available conformal coatings into an EMI shield.

A variety of resins and nanotubes for compounding were obtained. These coatings were cast thinly onto common FR4 PWB and shipped for EMI testing to an accredited test facility. The results from our first series of tests showed low levels of shielding (50% transmission, or 3 dB), however, subsequent rounds of testing provided much higher levels of shielding (>97%, or 15 dB). Equally important is that these coatings are very thin and due to low loading levels of nanotube, most other properties of the resin and coatings are unchanged. No difference in the processing of the filled and unfilled resins or coatings was observed. In other work, films were tested.

Types of Conformal Coatings

The source of conformal coating materials used was limited to one manufacturer. HumiSeal Inc was selected as our initial source of resins since they represent a large part of the market and can provide all the types of coatings. One of each type of conformal coating was evaluated:

HumiSeal 1A37HV represented the UV curable epoxy coatings.

HumiSeal 1B73 represented the thermally cured acrylic coatings.

HumiSeal 1A20 represented the thermally cured polyurethane coatings.

HumiSeal 1C49 represented the thermally cured silicone coatings.

The above resins were formulated with both single walled nanotubes and multi-walled nanotubes.

The Printed Circuit Board Substrate

The circuit board (e.g. printed wire board, printed circuit board) material used for the testing of this coating is commercially available 60-mil FR4 single clad printed circuit board, made by American Board Company (Vestal, N.Y.). The boards had a one mil copper cladding that was removed by the board manufacturer.

Removal of this cladding resulted in a 59 mil thick board. The board dimensions were 18"×24" prior to being cut into 18"×12" rectangles in order to facilitate the handling of the boards and testing.

Dispersion of Nanotubes

Both SWNT's and MWNT's were compounded into the conformal coatings. The nanotubes were purchased from several sources and experimented with each to find those most suitable for this demonstration. The SWNT's used for preparing the samples were obtained from Carbon Nanotechnologies Inc. These were used as delivered. The MWNT's were obtained from Sun Nanotech, and Deal International. Sonication of the samples was done using a Cole-Parmer ultrasonic homogenizer. Dispersion of the nanotubes was enhanced by sonication of the nanotubes in solvents like toluene or xylene for two cycles of 250 seconds. The dispersed nanotubes were separated from the solvent by centrifuging. The supernatant solvent was decanted and the remaining nanotubes were ready to be combined with the resin.

Formulation of Resin and Casting

HumiSeal 1A20 was formulated with the dispersed carbon nanotubes and also formulations of 1A20 were made with multi-walled carbon nanotubes. The single walled nanotubes were loaded at 0.05%, 0.1%, and 0.4% concentrations. The multi-walled nanotubes were loaded at 0.2%, 4%, and 5% concentrations. Uniform blending of the nanotubes into the coating material was achieved with an ultrasonic homogenizer. Sonication of the samples was done for two 250-second cycles. The formulated samples were coated on 18"×12" FR4 unclad PCB. Application of the coatings material was achieved using a # 28 FAUSTEL metering rod that gave a coating thickness of about 2.8 mils. The freshly coated samples were then placed in a vented preheated oven (100° C.) for 1 hour. The cured samples were then cut to 8"×8" squares. Two thin silver electrodes were painted on opposite sides of each of the 8"×8" panels. The conductivity of each of the panels was measured and these results are provided, along with the EMI test results in Table 1.

The free standing film of CP1 (shown in Table 2) resin was compounded with nanotubes and cast from NMP solutions (12% by weight) onto glass plates. They were then dried at 160° C. for eight hours in vacuum.

nas (HP11968C, HP11966E, HP11966F, and dipole antenna set HP11966H), magnetic field pickup coil HP11966K, active loop H-field HP11966A, goniometer model 63-844 MI, barometer model 602650 SB.

Testing Standards:

The above test equipment meets the applicable NIST, ASTM, ASME, OSHA, and state requirements. The test equipment was calibrated to standard traceable to the NIST. The calibration was performed per ISO 9001 § 4.11, ISO 9002 § 4.10, ISO 9003 § 4.6, ISO 9004 § 13, MIL-I 45208, IEEE-STD-498, NAVAIR-17-35-MTL-1, CSP-1/03-93, and

TABLE 1

Shielding Effectiveness Results

| Sample Type and Identification | Resistivity Ohms/Sq. | Thickness | Shielding Effectiveness Test, dB, at Frequency | | | | | |
|---|---|---|---|---|---|---|---|---|
| | | | 200 kHz | | 500 MHz | | 1.0 GHz | |
| | | | $SE_{pw}$ | $SE_m$ | $SE_{pw}$ | $SE_m$ | $SE_{pw}$ | $SE_m$ |
| HumiSeal 1A20 Control | $>10^{12}$ | 1.0 mil | 0.46 | 0.51 | 0.56 | 0.60 | 0.66 | 0.63 |
| 0.2% SWNT A | $1.2 \times 10^8$ | 1.0 mil | 0.36 | 0.42 | 0.46 | 0.48 | 0.51 | 0.50 |
| 0.05% SWNT B | $>10^{12}$ | 1.0 mil | 0.61 | 0.71 | 0.76 | 0.75 | 0.82 | 0.76 |
| 4.0% MWNT C | $>10^{12}$ | 1.0 mil | 1.1 | 1.2 | 1.2 | 1.3 | 1.4 | 1.3 |
| 5.0% MWNT D | $5.0 \times 10^8$ | 1.0 mil | 1.3 | 1.3 | 1.4 | 1.3 | 1.6 | 1.4 |
| 0.4% SWNT A2 | $4.0 \times 10^5$ | 1.0 mil | 3.0 | 3.1 | 3.2 | 3.1 | 3.4 | 3.2 |
| 0.4% SWNT A3 | $6.4 \times 10^4$ | 15 mil | 2.4 | 2.3 | 2.8 | 2.6 | 2.9 | 2.8 |
| 3-Layer B3 | $>10^{12}, 10^4, 10^8$ | 3.0 mil | 12.6 | 12.5 | 12.8 | 12.6 | 13.0 | 12.6 |

$SE_{pw}$—plane wave shielding effectiveness;
$SE_m$—magnetic wave shielding effectiveness

TABLE 2

Shielding Effectiveness Results from second round of Experiments

| Sample Type and Identification | Resistivity Ohms/Sq. | Thick | Shielding Effectiveness Test, dB, at Frequency | | | | | |
|---|---|---|---|---|---|---|---|---|
| | | | 200 kHz | | 5.0 GHz | | 10.0 GHz | |
| | | | $SE_{pw}$ | $SE_m$ | $SE_{pw}$ | $SE_m$ | $SE_{pw}$ | $SE_m$ |
| 1 Layer 1A20 & 0.2% SWNT | $>10^{12}$ | 1 | 9.34 | 7.34 | 9.7 | 8.02 | 9.9 | 8.15 |
| 1 Layer 1A20 & 4% MWNT | $1.2 \times 10^8$ | 1 | 10.4 | 7.87 | 10.9 | 8.21 | 11.1 | 8.31 |
| 2 Layer 1A20 & 4% MWNT | $10 \times 10^{12}$ | 1 | 11.5 | 9.13 | 12.1 | 9.51 | 12.4 | 9.63 |
| 2 Layer 1A20 & 0.2% SWNT | $1 \times 10^9$ | 1 | 10.3 | 7.43 | 10.8 | 8.1 | 11.0 | 8.21 |
| 2 layers 1A20 & MWNT and SWNT | $1.2 \times 10^9$ | 1 | 12.6 | 9.23 | 13.0 | 9.7 | 13.2 | 9.81 |
| 3 layers MWNT, SWNT, MWNT | $4.0 \times 10^5$ | 3 | 15.1 | 9.86 | 15.6 | 10.3 | 15.9 | 10.5 |
| 4 layers MWNT, SWNT, MWNT, SWNT | $6.4 \times 10^4$ | 4 | 15.3 | 9.91 | 15.7 | 10.4 | 15.9 | 10.6 |
| 0.3% SWNT in Si-DETA/Si-TMXDI Ceromer coating | $8.93 \times 10^5$ | 0.8 | 10.1 | 7.47 | 10.3 | 8.16 | 10.5 | 8.21 |
| 0.3% SWNT in CP-1 Polyimide film | $7.9 \times 10^6$ | 0.04 | 8.78 | 7.63 | 9.26 | 8.07 | 9.37 | 8.15 |

$SE_{pw}$—plane wave shielding effectiveness;
$SE_m$—magnetic wave shielding effectiveness
*Please Note: For samples #'s 1–7 the concentration of SWNT used was 0.4% and the concentration of MWNT used was 4.0%.

EMI Shielding Test

The testing was performed at the California Institute of Electronics and Material Science otherwise known as CIEMS (Hemet, Calif.).

Instruments and Devices:

The instruments and devices used by CIEMS and are described as follows: signal generator model 8592B (50 MHz to 22 MHz) HP, analyzer model 8592B (9 kHz to 22 GHz), dual preamplifier model 8847F HP, oscilloscope model IO-4540 HK with amplifier model 8347A HP, antenthe instrument manufacturers' specifications. The tests conformed to the following test standards: ASTM D4935, J.EEE-STD-299-1991, FED-STD-1037, MIL-STD-188-125A, MIL-STD-4610, and MIL-STD-462.

Test Conditions:

The test condition were as follows: t=22° C., RH=43%, P=101.4 kPa. Each magnitude of the plane wave ($SE_{pw}$) and magnetic ($SE_m$) shielding effectiveness in these measurements (See Results and Observations) was an average of six runs of the test specimens at each of the three test frequencies. The experimental error evaluated by the partial derivatives and least squares methods does not exceed 6%.

Test Range:

Due to the brevity in time and the high cost associated with determining shielding effectiveness over the frequency range of 200 MHz to 40 GHz it was decided that only discrete frequencies would be tested in a more narrow range. Specific frequencies chosen were 200 MHz, 500 MHz, and 1 GHz ranges. These ranges were chosen because of two reasons. These frequencies represented the low, middle, and high portion of the intended test range and cover the range where most consumer electronics operate.

The following assumption can be made: if EMI shielding is observed in the low and middle ranges the probability of observing EMI shielding in all the intermediary ranges is very likely. The same assumption can also be made regarding the middle to high frequency ranges.

Experimental Matrix: Table 1

A total of 5 coating formulations were sent out for initial analysis. These consisted of 4 samples of resin 1A20 formulated with 0.05%, 0.1%, and 0.4% single-walled nanotubes. The other two samples consisted of resin 1A20 formulated with 0.2% and 5% multi-walled nanotubes. The final thickness of most of the coatings was approximately 1 mil thick. Only one coating was cast to have a final thickness of 15 mils, the purpose being to determine if shielding effectiveness was thickness dependant.

Furthermore, a composite multi-layer conformal coating was fabricated to determine whether shielding effectiveness could be further enhanced. This experiment demonstrated that a synergistic effect between single-walled nanotubes and multi-walled nanotubes occurs when they are prepared as a multi-layer composite. Each layer has a different electrical resistance and was cast to about 1 mil each. This resulted in a relatively thin three mils coating with good shielding.

Technical Aspects

The results obtained in the above work clearly demonstrate technical feasibility by accomplishing at least the following objectives:

Compounded SWNT's and MWNT's into a series of commercial conformal coatings formulated from a wide range of polymer chemistries, such as urethane (thermal and UV curing), epoxy, acrylate, polyimide, and silicone.

Demonstrated that thin free standing films exhibit the same shielding.

Prepared uniform thin coatings on FR4 PWB substrates.

Demonstrated EMI shielding of 15 dB with very low loading levels of nanotubes and over 32 dB (or 99.9%) for 4 um thick monolayer of 50% SWNT and polymer binder.

Determined that thicker coating do not necessarily have higher shielding efficacy for these nanocomposites.

Demonstrated that layers are an effective means of increasing shielding effectiveness.

Identified important direction for future development of these nanocomposite coatings.

Observed no major technical road-blocks to the development of this technology.

These results provide strong evidence toward the use of carbon nanotubes in conformal coating to impart EMI shielding. These results also lead us to many questions as to the exact mechanism and how, if any synergy occurs between layers of different nanotubes. We also observed non-ohmic behavior in these coatings, with the electrical resistance dependant on the test voltage. The lower the test voltage the higher the electrical resistance, and the higher the test voltage the lower the measured resistance. This might not be surprising if one assumes that the mechanism of electrical conduction between tubes is by electron hopping or tunneling. It should also be noted that nanotube composites are also being investigated for use in magnetic shielding, which leads to the possibility of a second mechanism of EM absorption, since shielding can occur by absorbing or reflecting the electric or magnetic fields undulating in EM radiation.

Accordingly, a polymer processing technique for incorporating nanotubes into conformal coatings was demonstrated. This is a low cost approach to imparting EMI shielding characteristics to almost any conformal coating type. This approach yields a material which provides good EMI shielding in a very thin coating.

If existing polymers were to be developed into conformal coatings the process could take years of research (and millions in cost). This new type conformal coating would also require that application equipment be re-designed which could also run in the millions of dollars. Even after all the above is done the probability is low that these coatings will meet the barrier properties required for all military and commercial applications. In the end if these EMI shielding polymer systems are developed, the scope of use will most likely be very limited.

Presently there are no commercially available non-conducting conformal coatings that provide EMI shielding. The instant inventors have developed a conformal coating which when formulated with commercially available conformal coatings will provide EMI shielding properties in the 30–50 dB attenuation range. Nanotubes are added in such small amounts (<0.05% by weight) that coating properties such as mechanicals, viscosity, and cost are not appreciably affected. Using commercially available conformal coatings formulated as described herein means that little or no reformulation of the resin system is required. This also means that little or no modification of the application techniques or equipment is required. In a short time and at a fraction of the cost all types of conformal coatings can be formulated as described herein to fulfill EMI shielding requirements. This innovation will broaden the scope of use of existing conformal coatings that in turn will change military and civilian structures as they are known today.

Preparation of Spray Coatings

The second series of coating on FR4 were prepared using the procedure describe below, to yield a highly concentrated layer of nanotube with very low resistivity.

Advanced Nanotube Coating Procedure:

Apply HumiSeal 1A20 conformal coating cast onto to fiberglass FR4 circuit board;

Coating dried in an oven to remove solvents;

Spray coat a mixture of nanotubes in solvents plus a small amount of conformal coating;

Coating is dried in oven; and

If more protection of the coating is preferred, a thin layer of virgin conformal coating is applied, with a drying step to follow.

The first layer applied was a virgin conformal material coating sprayed onto the FR4 circuit board using conventional air spraying techniques and film casting as described above. This layer forms an insulating layer between the board (also components and conductors if populated) and the nanotube coating. After a drying step, the next process step was to spray coating of nanotubes over this layer. The single-walled carbon nanotubes were first exfoliated in toluene by sonicating techniques. After the removal of most of the toluene, a mixture of solvents was added (propylene glycol methyl acetate, xylene and ethyl benzene) to be compatible with the conformal coating.

This mixture of SWNT's and compatible solvents are applied through spray coating techniques onto the circuit board. The adding of a small amount of conformal coating to this mixture can elevate the need of a final protective over coating and results in a conductive top coat for grounding. Otherwise, a third very thin coating of virgin conformal coating could be applied. By using the same solvents as the original conformal coating, the nanotube coating will bond to the previous layer and interpenetrate. The solvents can be driven off relatively fast using standard oven drying in air. A series of these coating were prepared to span a range of electrical resistivity and were tested for SE using the wave guide apparatus describe in the next section.

EMI Shielding Test Apparatus and Procedures

EMI shielding effectiveness testing was conducted using both free space and wave guide methods as describe below.

The test equipment used in these EXAMPLES meets the applicable NIST, ASTM, ASME, OSHA, and state requirements. The test equipment was calibrated to standard traceable to the NIST. The calibration was performed per ISO 9001 § 4.11, ISO 9002 § 4.10, ISO 9003 § 4.6, ISO 9004 § 13, MIL-I 45208, IEEE-STD-498, NAVAIR-17-35-MTL-1, CSP-1/03-93, and the instrument manufacturers' specifications. The tests conformed to the following test standards: ASTM D4935, J.EEE-STD-299-1991, FED-STD-1037, MIL-STD-188-125A, MIL-STD-4610, and MIL-STD-462.

Wave Guide Testing:

Engineering Specialties Service (ESS) in East Bridgewater, Mass. was contacted to perform wave guide measurements. Due to the flat SE response of carbon nanotubes the frequency dependence is slight, allowing for fixed frequency analysis. The Wave guide test operates at a fix frequency by design and allows for very accurate testing of SE and other dielectric properties of materials. The method used a wave guide cavity where the material was measured at x-band frequencies. The frequencies tested were from 7.0 GHz to 12 GHz. All of the recorded readings were made at 10 GHz. The test consists of an RF input microwave sweeper, reference sensor, VSWR test channel, and insertion loss/phase test channel. Measurements made using the same coating on both free space and wave guide apparatus provide similar results.

Experimental Test Matrix and Results from SE Testing

The experimental test matrix is divided into two groups: 1) coatings prepared by compounding or dispersing the nanotubes into the conformal coating (discussed above) and 2) coatings prepared by forming an interpenetrated network of nanotubes on an unfilled conformal coating and then by sealing/binding with the conformal coating. Each of these groups was evaluated for SE, electrical resistivity, cure, and qualitative processing characteristics in comparison to unmodified conformal resin. SE testing was conducted by free space testing initially on all samples, however to speed development and evaluation we switched to a wave guide test which allowed much faster evaluation and feedback. Consequently, the final series of testing, which yielded the most impressive SE results, were entirely conducted using the more accurate fixed frequency wave guide test. The preparation of these coatings is describe in previous sections.

Results: Conformal Coatings with IPN of Nanotubes

The data presented here better demonstrates how carbon nanotubes can be utilized to impart high shielding effectiveness to literally any resin, including conformal coatings. The application technique employed to prepare these coatings allows for the concentration of nanotubes into a highly conductive layer within any protective conformal coating to yield an effective EMI shield using traditional processing technology. The test results were selected from a larger set of samples to fully represent the range of results obtained for a wide range of coating resistivity levels. As can be seen, using this coating technique coating can be produced with a very wide range of electrical resistivity. In fact, coated specimens were made with much higher resistivity (tunable from $10^0$ to $10^{12}$ Ohms/Square) although many are not shown since those with higher resistivity exhibit lower SE. Coatings with resistivity higher than ~100 Ohms are also transparent to visible light, and are nearly colorless to the eye in coatings with resistivity higher than ~1000 Ohms. These observations have lead to the evaluation of these coatings for numerous other applications.

TABLE 3

Shielding Effectiveness Test Results from Spray Coated Nanotubes Forming a IPN with HumiSeal 1A20 Urethane Conformal Coating

| Sample # | Description | Ohms/Square | Thickness Mils* | Measured VSWR | Measured SE (db) |
|---|---|---|---|---|---|
| 1 | Virgin FR4 Board | >$10^{12}$ | 0 | 2.12 | 0.5 |
| 2 | SWnT coated | 2.6 × $10^3$ | <0.1 | 4.19 | 8.8 |
| 3 | SWnT coated | 820 | <0.1 | 4.21 | 8.2 |
| 4 | Purified SWnT | 221 | <0.1 | 5.84 | 10.0 |
| 5 | Purified SWnT Thick | 46 | 0.16 | >20 | 20.6 |
| 6 | D/V SWnT | 2.0 | 0.59 | 0.38 | 28.9 |
| 7 | E/V SWnT | 2.0 | 0.43 | 0.41 | 38.6 |
| 8 | E/V SWnT | 1.9 | 0.43 | 0.21 | 35.5 |
| 9 | E Silver | 0.02 | 3 | 0.41 | 54.0 |

*Thickness in 1/1000 inches for the active layer containing nanotubes
**The detector level of sensitivity and calibration limit the measured SE to a <55 dB max value.

The above demonstrates EMI shielding of ~40 dB with very thin coatings of nanotubes layered in the conformal coating resin to form a interpenetrated network of tubes within the resin. The above also demonstrates that layers are an effective means of increasing shielding effectiveness.

All references cited herein, including all U.S. and foreign patents and patent applications, as well as any other documents or reference materials cited herein, are specifically and entirely hereby incorporated by reference. It is intended that the specification and examples be considered exemplary only.

The invention claimed is:

1. A conformal coating that provides EMI shielding, wherein said coating comprises:
   an insulating layer; and
   a conductive layer wherein said conductive layer comprises an electrically conductive material and said electrically conductive material comprises carbon nanotubes having an outer diameter of 3.5 nm or less, wherein the EMI shielding is at least 10 dB.

2. The conformal coating of claim 1, wherein said insulating layer comprises a material selected from the group consisting of polyurethanes, parylene, acrylics, epoxy, silicone and mixtures thereof.

3. The conformal coating of claim 1, wherein the conducting layer provides EMI shielding properties in the 10–70 dB attenuation range.

4. The conformal coating of claim 1, wherein the conducting layer has a surface resistance in the range of less than about $10^4$ ohms/square.

5. The conformal coating of claim 1, wherein the conductive layer is over-coated with a polymeric layer comprising a conformal coating material selected from the group consisting of polyurethanes, parylene, acrylics, epoxies and silicone.

6. The conformal coating of claim 1, wherein the conductive layer further contains an electrically conductive material selected from the group consisting of carbon black, an electrically conductive metal, structurally-modified carbon nanotubes, chemically-modified carbon nanotubes and combinations thereof.

7. The conformal coating of claim 3, wherein the conducting layer provides EMI shielding properties in the 40–70 dB attenuation range.

8. The conformal coating of claim 1, wherein the carbon nanotubes are selected from the group consisting of single-walled nanotubes, double-walled nanotubes, multi-walled nanotubes, and mixtures thereof.

9. The conformal coating of claim 1, wherein the carbon nanotubes are substantially single-walled nanotubes.

10. The conformal coating of claim 1, wherein the carbon nanotubes are present in said nanotube-containing layer at about 0.1 to about 0.5%.

11. The conformal coating of claim 1, wherein the carbon nanotubes are oriented.

12. The conformal coating of claim 1, wherein the carbon nanotubes are chemically modified.

13. The conformal coating of claim 1, wherein the conductive layer further comprises a polymeric material, wherein the polymeric material comprises a material selected from the group consisting of thermoplastics, thermosetting polymers, elastomers, conducting polymers and combinations thereof.

14. The conformal coating of claim 1, wherein the conductive layer further comprises a polymeric material, wherein the polymeric material comprises a material selected from the group consisting of polyethylene, polypropylene, polyvinyl chloride, styrenic, polyurethane, polyimide, polycarbonate, polyethylene terephthalate, cellulose, gelatin, chitin, polypeptides, polysaccharides, polynucleotides and mixtures thereof.

15. The conformal coating of claim 1, wherein the conductive layer further comprises a polymeric material, wherein the polymeric material comprises a material selected from the group consisting of ceramic hybrid polymers, phosphine oxides, chalcogenides, and combinations thereof.

16. The conformal coating of claim 1, wherein the conductive layer further comprises a conformal coating material selected from the group consisting of polyurethanes, parylene, acrylics, epoxies, silicone and combinations thereof.

17. The conformal coating of claim 1, wherein the conductive layer further comprises a polymeric material wherein the nanotubes are dispersed substantially homogenously throughout the polymeric material.

18. The conformal coating of claim 1, wherein the conductive layer further comprises an additive selected from the group consisting of a dispersing agent, a binder, a cross-linking agent, a stabilizer agent, a coloring agent, a UV absorbent agent, a charge adjusting agent and combinations thereof.

19. The conformal coating of claim 1, wherein the conductive layer has a transmittance of at least about 60%.

20. The conformal coating of claim 1, wherein the carbon nanotubes are single-wall carbon nanotubes and the EMI shielding is from 10–70 dB attenuation range.

21. A coated substrate with EMI shielding comprising:
a) a substrate; and
b) conformal coating disposed on said substrate that provides at least 10 dB of EMI shielding, wherein said coating comprises:
an insulating layer; and
a carbon nanotube-containing layer disposed on said insulating layer, wherein said carbon nanotube-containing layer comprises a plurality of carbon nanotubes having an outer diameter of 3.5 nm or less.

22. The coated substrate of claim 21, wherein the substrate is part of a device component selected from the group consisting of keypads, catheters, integrated circuits, printed wire boards, printed circuit boards, hybrids, transducers, sensors, cores, accelerometers, catheters, coils, fiber optic components, heat exchangers, pacemakers, implants, flow meters, magnets, photoelectric cells, electrosurgical instruments, and plastic encapsulated microcircuits.

23. The coated substrate of claim 21, wherein the insulating layer comprises a material selected from the group consisting of polyurethanes, parylene, acrylics, epoxy and silicone.

24. The coated substrate of claim 21, wherein the carbon nanotubes are selected from the group consisting of single-walled nanotubes, double-walled nanotubes, multi-walled nanotubes, and mixtures thereof.

25. The coated substrate of claim 21, wherein the carbon nanotube-containing layer further comprises a conformal coating material selected from the group consisting of polyurethanes, parylene, acrylics, epoxies and silicone.

26. The coated substrate of claim 21, wherein the carbon nanotubes are substantially single-walled nanotubes.

27. The coated substrate of claim 21, wherein the carbon nanotube-containing layer has a surface resistance in the range of less than about $10^4$ ohms/square.

28. The coated substrate of claim 21, wherein the carbon nanotube-containing layer further comprises an additive selected from the group consisting of a dispersing agent, a binder, a cross-linking agent, a stabilizer agent, a coloring agent, a UV absorbent agent, and a charge adjusting agent.

29. The coated substrate of claim 21, wherein the carbon nanotube-containing layer has a total transmittance of at least about 60%.

30. The coated substrate of claim 21, wherein the carbon nanotubes are oriented.

31. The coated substrate of claim 21, wherein the carbon nanotube-containing layer is over-coated with a polymeric layer comprising a conformal coating material selected from the group consisting of polyurethanes, parylene, acrylics, epoxies and silicone.

32. The coated substrate of claim 21, wherein the carbon nanotube-containing layer provides EMI shielding properties in the 10–70 dB attenuation range.

33. The coated substrate of claim 21, wherein the carbon nanotubes are chemically modified.

34. The coated substrate of claim 21, wherein the carbon nanotubes are single-wall carbon nanotubes the EMI shielding is from 10–70 dB attenuation range.

* * * * *